United States Patent
Hasegawa et al.

(10) Patent No.: US 7,985,680 B2
(45) Date of Patent: Jul. 26, 2011

(54) METHOD OF FORMING ALUMINUM-DOPED METAL CARBONITRIDE GATE ELECTRODES

(75) Inventors: Toshio Hasegawa, Delmar, NY (US); Gerrit J Leusink, Saltpoint, NY (US)

(73) Assignee: Tokyo Electron Limited, Tokyo (JP)

( * ) Notice: Subject to any disclaimer, the term of this patent is extended or adjusted under 35 U.S.C. 154(b) by 198 days.

(21) Appl. No.: 12/197,756

(22) Filed: Aug. 25, 2008

(65) Prior Publication Data
US 2010/0048009 A1 Feb. 25, 2010

(51) Int. Cl.
*H01L 21/44* (2006.01)
(52) U.S. Cl. .................... 438/681; 257/E21.006
(58) Field of Classification Search .............. 438/582, 438/681; 257/E21.006, E21.128
See application file for complete search history.

(56) References Cited

U.S. PATENT DOCUMENTS

| | | | |
|---|---|---|---|
| 4,116,682 A | 9/1978 | Polk | |
| 6,444,263 B1 | 9/2002 | Paranjpe | |
| 6,445,023 B1 | 9/2002 | Vaartstra | |
| 6,583,052 B2 | 6/2003 | Shin | |
| 6,593,484 B2 | 7/2003 | Yasuhara et al. | |
| 6,630,201 B2 | 10/2003 | Chiang | |
| 6,770,560 B2 | 8/2004 | Abe | |
| 6,861,334 B2 | 3/2005 | Raaijmakers | |
| 6,979,856 B2 | 12/2005 | Nishizaka | |
| 7,098,131 B2 | 8/2006 | Kang | |
| 7,186,446 B2 | 3/2007 | Kim et al. | |
| 2002/0137332 A1 | 9/2002 | Paranjpe et al. | |
| 2002/0192952 A1 | 12/2002 | Itoh et al. | |
| 2004/0009654 A1 | 1/2004 | Abe | |
| 2004/0192021 A1 | 9/2004 | Li | |
| 2005/0124154 A1 | 6/2005 | Park | |
| 2005/0179097 A1 | 8/2005 | Forbes | |
| 2005/0221021 A1 | 10/2005 | Strang | |
| 2006/0027925 A1 | 2/2006 | Huang et al. | |
| 2006/0063375 A1 | 3/2006 | Sun | |
| 2006/0113675 A1 | 6/2006 | Chang | |
| 2006/0210723 A1 | 9/2006 | Ishizaka | |
| 2006/0211223 A1 | 9/2006 | Brcka | |
| 2006/0211224 A1 | 9/2006 | Matsuda | |
| 2006/0211243 A1 | 9/2006 | Ishizaka | |
| 2006/0211246 A1 | 9/2006 | Ishizaka et al. | |
| 2006/0213437 A1 | 9/2006 | Ishizaka | |
| 2006/0213439 A1 | 9/2006 | Ishizaka | |

(Continued)

FOREIGN PATENT DOCUMENTS
WO WO2008031492 3/2008

OTHER PUBLICATIONS
United States Patent and Trademark Office, Final Office Action issued on Nov. 25, 2009, in related case U.S. Appl. No. 11/839,410, 27 pages.

(Continued)

*Primary Examiner* — W. David Coleman

(57) ABSTRACT

A method for forming an aluminum-doped metal (tantalum or titanium) carbonitride gate electrode for a semiconductor device is described. The method includes providing a substrate containing a dielectric layer thereon, and forming the gate electrode on the dielectric layer in the absence of plasma. The gate electrode is formed by depositing a metal carbonitride film, and adsorbing an atomic layer of an aluminum precursor on the metal carbonitride film. The steps of depositing and adsorbing may be repeated a desired number of times until the aluminum-doped metal carbonitride gate electrode has a desired thickness.

20 Claims, 6 Drawing Sheets

U.S. PATENT DOCUMENTS

| | | | |
|---|---|---|---|
| 2006/0251872 | A1 | 11/2006 | Wang |
| 2006/0267205 | A1 | 11/2006 | Koerner |
| 2007/0059502 | A1 | 3/2007 | Wang |
| 2007/0059929 | A1* | 3/2007 | Cho et al. ............... 438/681 |
| 2007/0075427 | A1 | 4/2007 | Lavoie et al. |
| 2007/0116887 | A1 | 5/2007 | Faquet |
| 2007/0116888 | A1 | 5/2007 | Faquet |
| 2007/0218704 | A1 | 9/2007 | Ishizaka |
| 2007/0231487 | A1 | 10/2007 | Ishizaka |
| 2007/0251445 | A1 | 11/2007 | Ishizaka |
| 2008/0132050 | A1 | 6/2008 | Lavoie |
| 2008/0141937 | A1 | 6/2008 | Clark |
| 2008/0164581 | A1 | 7/2008 | Cho et al. |
| 2009/0325372 | A1 | 12/2009 | Harada |

OTHER PUBLICATIONS

United States Patent and Trademark Office, Advisory Action issued on Apr. 19, 2010, in related case U.S. Appl. No. 11/839,410, 9 pages.

M.E. Gross et al, Journal of Vacuum Science and Technology B, American Vacuum Society, pp. 1548-1552, vol. 6, 1988.

T. Maruyama et al., Cobalt Thin Films Prepared by Chemical Vapor Deposition from Cobaltous Acetate, Applied Physics Letters, American Institute of Physics, Melville, NY, Sep. 16, 1991, pp. 1433-1434, vol. 59.

G.J.M. Dormans, OMCVD of Transition Metal and Their Silicides using Metallocenes and (Di)silane or Silicon Tetra-bromide, Journal of Crystal Growth, Elsevier Science Publishers B.V. (North Holland), pp. 806-816, vol. 108, 1991.

A.R. Ivanova et al., The Effects of Processing Parameters in the Chemical Vapor Deposition of Cobalt from Cobalt Tricarbonyl Nitrosyl, Journal of The Electrochemical Society, The Electrochemical Society, pp. 2139-2145, vol. 146, No. 6, 1999.

B.S. Lim et al., Atomic Layer Deposition of Transition Metals, Nature Materials, Nature Publishing Group, pp. 749-754, vol. 2, 2003.

S.B. Kang et al., CVD-Cobalt for the Next Generation of Source/Drain Salicidation and Contact Silicidation in Novel MOS Device Structures with Complex Shape, IEEE International Electron Devices Meeting (IEDM), Washington DC, Dec. 8-10, 2003, 4 pgs.

H. Bhandari et al., Vapor Deposition of Barrier/Adhesion/Seed Layers for Copper Interconnects, Materials Research Society, Spring Meeting, Mar. 25-27, 2008. Abstract only.

H.S. Rhee et al., Cobalt Metalorganic Chemical Vapor Deposition and Formation of Epitaxial CoSi2 Layer on Si(100) Substrate, Journal of The Electrochemical Society, The Electrochemical Society, Inc., pp. 2720-2724, vol. 146, No. 7, 1999.

A.R. Londergan et al., Interlayer Mediated Epitaxy of Cobalt Silicide on Silicon(100) from Low Temperature Chemical Vapor Deposition of Cobalt, Journal of The Electrochemical Society, The Electrochemical Society, Inc., pp. C21-C27, vol. 148, No. 1, 2001.

K. Kim, Characteristics of Cobalt Thin Films Deposited by Remote Plasma ALD Method with Dicobalt Octacarbonyl, Journal of The Electrochemical Society, The Electrochemical Society, Inc., pp. H177-H181, vol. 154, No. 3, 2007.

J. Lee et al., Highly Conformal Deposition of Pure Co Films by MOCVD Using Co2(CO)8 as a Precursor, Journal of The Electrochemical Society, The Electrochemical Society, Inc., pp. G539-G542, vol. 153, No. 6, 2006.

K. Lee et al, Characteristics of Ti-Capped Co Films Deposited by a Remote Plasma ALD Method Using Cyclopentadienylcobalt Dicarbonyl, Journal of The Electrochemical Society, The Electrochemical Society, Inc., pp. H899-H903, vol. 154, No. 10, 2007.

G.J.M. Dormans et al., OMCVD of Cobalt and Cobalt Silicide, Journal of Crystal Growth, Elsevier Science Publishers B.V. (North Holland), pp. 364-372, vol. 114, 1991.

F. Maury et al., Epitaxial Growth of CoGa on GaAs by Organometallic Chemical Vapor Deposition, Chemistry of Materials, American Chemical Society, pp. 84-89, vol. 5, 1993.

Z. Li et al., Nucleation and Adhesion of ALD Copper on Cobalt Adhesion Layers and Tungsten Diffusion Barriers, Electrochemical and Solid-State Letters, The Electrochemical Society, Inc., pp. G182-G185, vol. 8, No. 7, 2005.

Jun et al., Low Temperature Deposition of TaCN Films Using Pentakis(diethylamido)tantalum, Jan. 15, 1998, Jpn. J. Appl. Phys., pp. L30-L32 Part 2, No. 1A/B.

Elert, Glenn. "Resistivity of Aluminum," 2004, The Physics Factbook, http://hypertextbook.com/facts/2004/ ValPolyakov.shtml.

Alen, P., Juppo et al., Atomic layer deposition of Ta(Al)N(C) thin films using trimethylaluminum as a reducing agent, Journal of the Electrochemical Society, vol. 148, No. 10, p. G566-G571, Aug. 31, 2001.

United States Patent and Trademark Office, International Search Report and the Written Opinion of the International Searching Authority in corresponding PCT Application No. PCT/US09/54707, issued Oct. 15, 2009, 8 pages.

"Aluminum" from Chemical Elements: From Carbon to Krypton, Authors: David E. Newton and Lawrence W. Baker, Detroit, MI, 1998, 9 pages.

Park, J.S. et al., "Plasma-enhanced atomic layer deposition of tantalum nitrides using hydrogen radicals as a reducing agent," Electrochemical and Solid-State Letters, 2001, vol. 4, No. 4, pp. C17-C19.

United States Patent and Trademark Office, Office Action issued on Nov. 15, 2007 in case U.S. Appl. No. 11/378,271, 6 pages.

International Seach Report and the Written Opinion of the International Searching Authority issued on Nov. 19, 2007 in International Application PCT/US07/03215 corresponding to case U.S. Appl. No. 11/378,271, 7 pages.

United States Patent and Trademark Office, Office Action issued on Dec. 9, 2008 in related case U.S. Appl. No. 11/839,410, 23 pages.

United States Patent and Trademark Office, Office Action issued on Jun. 17, 2009 in related case U.S. Appl. No. 11/839,410, 25 pages.

Kim, J.Y., et al. "Basic characteristics of TaN films deposited by using the remote plasma enhanced atomic layer deposition method," Journal of the Korean Physical Society, Oct. 2004, vol. 45, No. 4, pp. 1069-1073.

Shin, "Diffusion barrier property of TiN and TiN/Al/TiN films deposited with FMCVD for Cu interconnection in ULSI", Sci. and Technol. Adv. Materials, vol. 5, 2004, p. 399-405.

Kwon, "Plasma-Enhanced Atomic Layer Deposition of Ru-TiN Thin Films for Copper Diffusion Barrier Materials", J. Electrochem. Soc. vol. 153(6), 2006, p. G578-G581.

United States Patent and Trademark Office, Final Office Action issued on Feb. 17, 2011, in case U.S. Appl. No. 12/058,595, 12 pages.

United States Patent and Trademark Office, non Final Office Action issued on Dec. 6, 2010, in case U.S. Appl. No. 11/839,410, 16 pages.

Manasevit, H.M. "The Use of Metalorganics in the Preparation of Semiconductor Materials" J. Cryst. Growth vol. 13-14, May 1972, pp. 306-314.

Kim, H. "Robust TaNx diffusion barrier for Cu-interconnect technology by subnanometer thickness by metal-organic plasma-enhanced atomic layer deposition" J. Appl. Phys. 98, Jun. 6, 2005, pp. 014308.

Liu, X. "Atomic Layer Deposition of Aluminum Nitride Thin Films from Trimethyl Aluminum (TMA) and Ammonia" Mat. Res. Soc. Symp. Proc. vol. 811, 2004, pp. D1.9.1.

United States Patent and Trademark Office, non Final Office Action issued on Jun. 24, 2010, in case U.S. Appl. No. 11/839,410, 18 pages.

United States Patent and Trademark Office, non Final Office Action issued on Sep. 2, 2010, in case U.S. Appl. No. 12/058,595, 13 pages.

* cited by examiner

METHOD OF FORMING ALUMINUM-DOPED METAL CARBONITRIDE GATE ELECTRODES

CROSS-REFERENCE TO RELATED APPLICATION

This application is related to co-pending U.S. patent application Ser. No. 11/839,410 entitled "SEMICONDUCTOR DEVICE CONTAINING AN ALUMINUM TANTALUM CARBONITRIDE BARRIER FILM AND METHOD OF FORMING," filed on Aug. 15, 2007, the entire content of which is hereby incorporated by reference.

FIELD OF INVENTION

The field of the invention relates generally to the field of forming a semiconductor device, and more specifically to formation of aluminum-doped metal carbonitride gate electrodes with tunable aluminum concentrations.

BACKGROUND OF THE INVENTION

In the semiconductor industry, the minimum feature sizes of microelectronic devices are approaching the deep sub-micron regime to meet the demand for faster, lower power microprocessors and digital circuits. The Si-based microelectronic technology is currently faced with major materials challenges to achieve further miniaturization of integrated circuit devices. A gate stack containing a $SiO_2$ gate dielectric layer and a degenerately doped polycrystalline Si gate electrode, which has served the industry for several decades, will be replaced with a gate stack having a higher capacitance.

High-capacitance materials, known as high-k materials (where "k" refers to the dielectric constant of the material), feature a dielectric constant greater than that of $SiO_2$ (k~3.9). In addition, high-k materials may refer to dielectric materials such as metallic silicates or oxides that are deposited onto substrates (e.g., $HfO_2$, $ZrO_2$) rather than grown on the surface of the substrates (e.g., $SiO_2$, $SiO_xN_y$).

In addition to the gate dielectric layer, the gate electrode also represents a major challenge for future scaling of microelectronic devices. The introduction of metal-containing gate electrodes to replace the traditional doped poly-Si gate electrode can bring about several advantages. These advantages include elimination of the poly-Si gate depletion effect, reduction in sheet resistance, better reliability and potentially better thermal stability on the advanced high-k dielectric materials. In one example, switching from poly-Si to a metal-containing gate electrode can achieve a 2-3 Angstrom (Å) improvement in the effective or electrical thickness of the gate stack. This improvement occurs largely because the problem of poly-Si depletion at the interfaces with other materials is removed entirely.

Workfunction, resistivity, and compatibility with complementary metal oxide semiconductor (CMOS) technology are key parameters for the new gate electrode materials. Positive-channel Metal Oxide Semiconductor (PMOS) and the Negative-channel Metal Oxide Semiconductor (NMOS) transistor gate electrodes require different gate materials to achieve acceptable threshold voltages; the former having a Fermi level near the silicon valence band (E~4 eV), and the latter having a Fermi level near the conduction band (E~5.1 eV).

Conventional technology for controlling the work function of a gate electrode includes band-edge metal approach where a metal with a specific workfunction is selected; a P-metal (Re, Co, Ni, Ru, Pt, etc) with a workfunction greater than about 5 eV; and a N-metal (Ta, Hf, Y, La, Ir, etc) with a workfunction less than about 4.5 eV. However, the effective workfunction of a gate stack further depends on bulk and surface material properties, crystallographic orientation, and the permittivity of the high-k film interfacing with the gate electrode. In particular, interactions of the different materials at layer interfaces and diffusion of chemical species throughout a gate stack during post-processing, such as high temperature anneals, can affect the work function and other properties of the semiconductor device.

Recently, gate electrode metals and dielectric threshold voltage adjustment layers have been utilized to control the work function of gate stacks and to obtain the desired threshold voltages for N-MOS and P-MOS transistors in a manufactured semiconductor device. Exemplary threshold voltage adjustment layers include lanthanum oxide ($La_2O_3$) for N-MOS devices and aluminum oxide ($Al_2O_3$) for P-MOS devices. The dielectric threshold voltage adjustment layers have generally been positioned above the high-k gate dielectric and in contact with the gate electrode. It has been shown that during high temperature processing, elements in the dielectric threshold voltage adjustment layers generally diffuse through the high-k gate dielectric towards an interface layer (e.g., a high mobility, low defect $SiO_2$ layer) positioned between the high-k gate dielectric and the substrate to cause threshold voltage adjustment near the interface of the high-k gate dielectric and the underlying interface layer. However, element(s) of some dielectric threshold voltage adjustment layers may not sufficiently diffuse through the high-k gate dielectric to fully adjust the threshold voltage of the semiconductor device to the desired value.

Thus, in view of the above-mentioned problems, new methods are needed for integrating metal-containing gate electrodes into gate stacks, and in particular, new methods are needed that allow for forming metal-containing gate electrodes with tunable workfunctions.

SUMMARY OF THE INVENTION

Embodiments of the invention provide a method for forming aluminum-doped metal (tantalum or titanium) carbonitride gate electrodes with tunable aluminum concentrations. According to embodiments of the invention, tantalum carbonitride (TaCN) or titanium carbonitride (TiCN) films are deposited by chemical vapor deposition (CVD) in the absence of plasma and doped with aluminum to tune the workfunction and threshold voltage ($V_t$).

According to one embodiment, the method includes providing a substrate containing a dielectric layer thereon, and forming an aluminum-doped metal carbonitride gate electrode on the dielectric layer in the absence of plasma. The aluminum-doped metal carbonitride gate electrode is formed by depositing a metal carbonitride film through exposing the substrate to a gas pulse of a metal carbonitride precursor, where the metal carbonitride precursor contains tantalum, titanium, or a combination thereof. The method further includes adsorbing an atomic layer of an aluminum precursor on the metal carbonitride film by exposing the substrate to a gas pulse of the aluminum precursor, where, during the depositing and adsorbing, the substrate is maintained at a temperature above the thermal decomposition temperature of the metal carbonitride precursor and below the thermal decomposition temperature of the aluminum precursor. The steps of depositing and adsorbing may be repeated a desired number of times until the aluminum-doped metal carbonitride gate electrode has a desired thickness.

BRIEF DESCRIPTION OF THE DRAWINGS

The present invention is illustrated by way of example and not as a limitation in the figures of the accompanying drawings.

DETAILED DESCRIPTION OF SEVERAL EMBODIMENTS

Figure 1A:
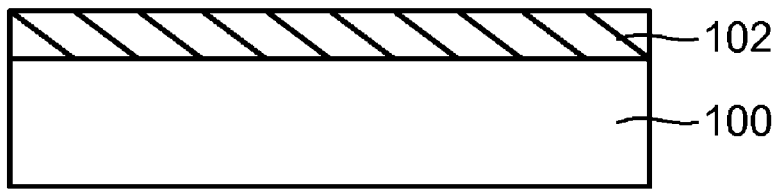
FIGS. 1A-1C show schematic cross-sectional views of a method for forming a gate stack containing an aluminum-doped metal carbonitride gate electrode according to an embodiment of the invention.

Formation of aluminum-doped metal carbonitride gate electrodes and gate stacks containing such gate electrodes is disclosed in various embodiments. The aluminum-doped metal carbonitride gate electrodes contain aluminum (Al), carbon (C), nitrogen (N), and tantalum (Ta) and/or titanium (Ti). The aluminum-doped metal carbonitride gate electrodes can further contain impurities such as oxygen (O), chlorine (Cl), and hydrogen (H), that may originate from the film deposition process and/or substrate transfer in air following the film deposition process. In some examples, the aluminum-doped metal carbonitride gate electrodes may contain combinations of 1-50 atomic percent C and 1-50 atomic percent N. In some embodiments, the aluminum tantalum carbonitride gate electrodes comprise at least 5 (and in some embodiments, at least 10, 15, 20, 25, 30, 35, 40, 45, or even at least 50) atomic percent aluminum. According to one embodiment, the aluminum-doped metal carbonitride gate electrodes can contain between 5 and 50 atomic percent aluminum. This allows for varying the workfunction of the aluminum-doped metal carbonitride gate electrodes over several tenths of an electron volt (eV).

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1B:
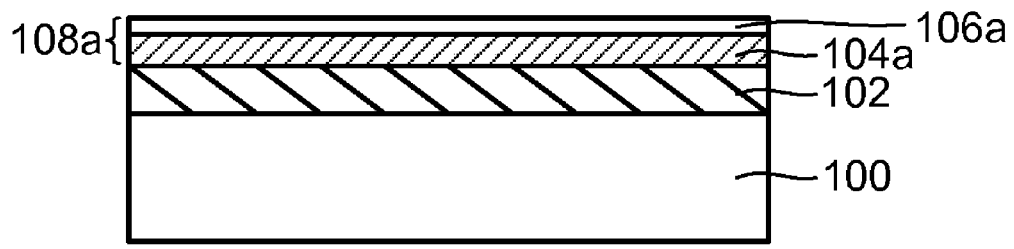
Figure 1C:
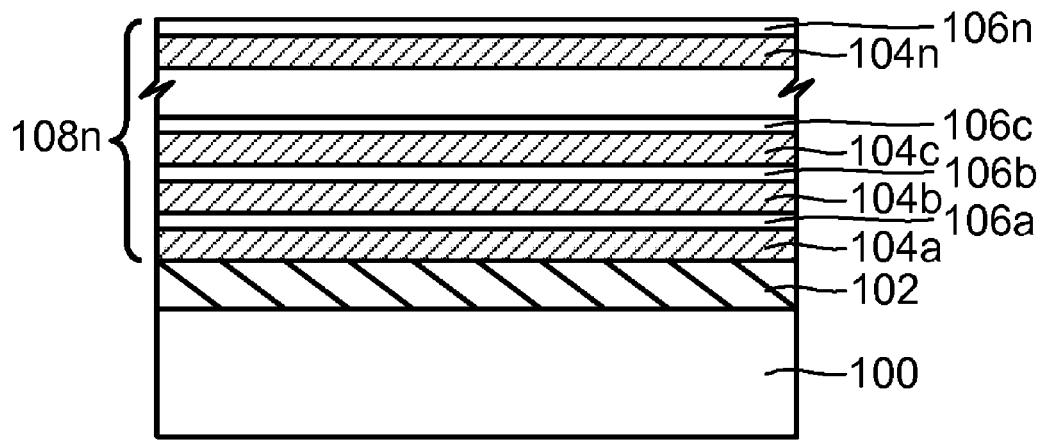

FIGS. 1A-1C show schematic cross-sectional views of a method for forming a gate stack containing an aluminum-doped metal carbonitride gate electrode according to an embodiment of the invention. FIG. 1A schematically shows a substrate 100 containing a high-k film 102 formed thereon. The substrate 100 can be of any size, for example a 200 mm substrate, a 300 mm substrate, or an even larger substrate. According to one embodiment, the substrate 100 can contain Si, for example crystalline Si, polycrystalline Si, or amorphous Si. In one example, the substrate 100 can be a tensile-strained Si layer. According to another embodiment, the substrate 100 may contain Ge or $Si_xGe_{1-x}$ compounds, where x is the atomic fraction of Si, 1−x is the atomic fraction of Ge, and $0<1-x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can be a compressive-strained Ge layer or a tensile-strained $Si_xGe_{1-x}$ (x>0.5) deposited on a relaxed $Si_{0.5}Ge_{0.5}$ buffer layer. Although not shown, the structure in FIG. 1A may further include an interface layer between the substrate 100 and the high-k film 102. The interface layer can, for example, contain a silicon oxynitride (SiON) or a high mobility, low defect $SiO_2$ with a thickness between about 5 and about 15 angstrom, for example about 8 angstrom.

The high-k film 102 can, for example, contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof. However, other high-k dielectric materials are contemplated and may be used.

FIG. 1B schematically shows an aluminum-doped metal carbonitride gate electrode 108a formed on the high-k film 102. The aluminum-doped metal carbonitride gate electrode 108a contains a metal carbonitride film 104a formed on the high-k film 102 and an atomic layer 106a of an aluminum precursor adsorbed on the metal carbonitride film 104a. The metal carbonitride film 104a can be deposited by exposing the high-k film 102 to a metal carbonitride precursor that thermally decomposes on the high-k film 102 in the absence of plasma. Following the exposure to the metal carbonitride precursor, the metal carbonitride film 104a is exposed to an aluminum precursor in the absence of a plasma to form the atomic layer 106a on the metal carbonitride film 104a. The atomic layer 106a comprises a partially decomposed aluminum precursor. In one example, the aluminum precursor contains trimethyl aluminum (AlMe$_3$, Al(CH$_3$)$_3$, TMA) and it is contemplated that the atomic layer 106a may comprise AlMe$_x$.

Figure 4:
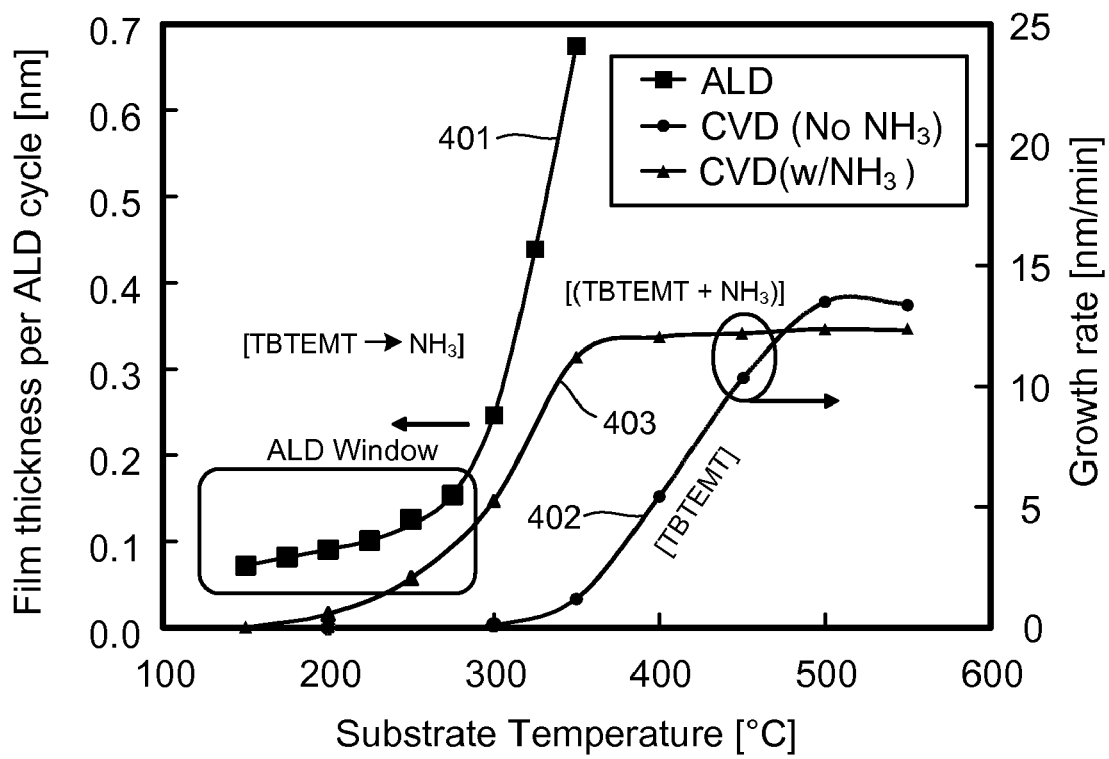
FIG. 4 shows experimental data for tantalum carbonitride films deposited on a substrate using a TBTEMT precursor.
Figure 5:
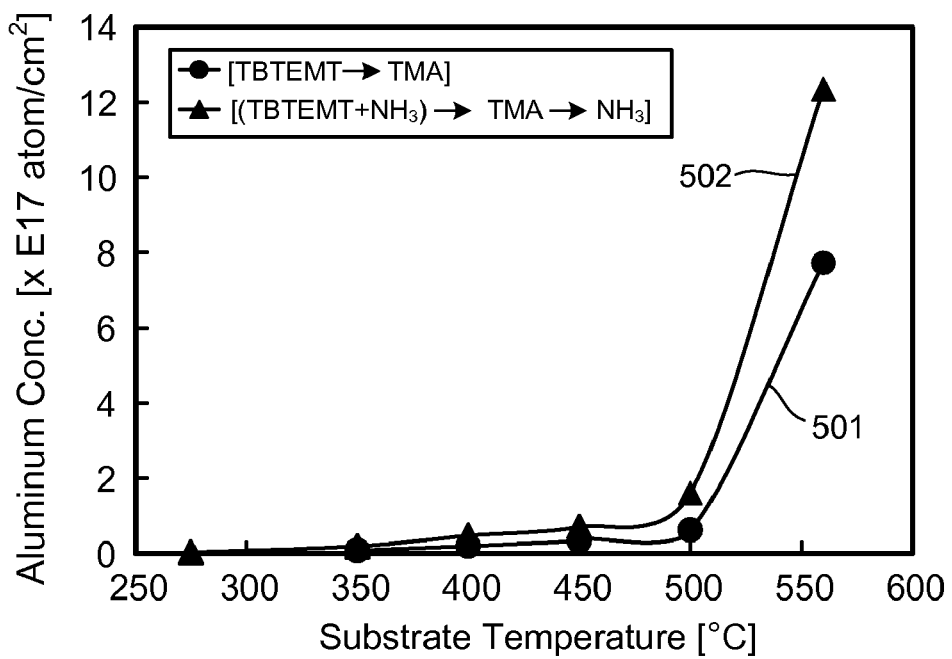
FIG. 5 shows experimental data for aluminum concentration in aluminum-doped tantalum carbonitride films as a function of substrate temperature.

According to embodiments of the invention, during formation of the aluminum-doped metal carbonitride gate electrode 108a, the substrate 100 is maintained at a temperature that is higher than the thermal decomposition temperature of the metal carbonitride precursor and lower than the thermal decomposition temperature of the aluminum precursor. This allows for thermal chemical vapor deposition (CVD) of the metal carbonitride film 104a, where the thickness of the metal carbonitride film 104a is proportional to the length of the exposure to the metal carbonitride precursor. Conversely, the exposure of metal carbonitride film 104a to the aluminum precursor is not dependent on the length of the exposure once self-limiting saturation of approximately one atomic layer 106a of the aluminum precursor, or less, is achieved on the metal carbonitride film 104a. The thermal decomposition temperature of the metal carbonitride precursor and aluminum precursor may be determined by experimentation as shown in FIGS. 4 and 5, respectively.

The alternating exposures to the metal carbonitride precursor and the aluminum precursor may be repeated any number of times. FIG. 1C schematically shows an aluminum-doped metal carbonitride gate electrode 108n after performing the alternating exposures of the metal carbonitride precursor and aluminum precursor a total of n times each to form metal carbonitride films 104a, 104b, 104c, . . . , 104n, and atomic layers 106a, 106b, 106c, . . . , 106n. According to one embodiment of the invention, the aluminum-doped metal carbonitride gate electrode 108n can contain between 2 and 40 metal carbonitride films, or between 5 and 20 metal carbonitride films. The amount of aluminum in the aluminum-doped metal carbonitride gate electrode 108n may be selected by controlling the thickness of each metal carbonitride film 104a, 104b, . . . , 104n. The aluminum-doped metal carbonitride gate electrode 108n may be annealed in order to further intermix the metal carbonitride films and the aluminum and form an amorphous aluminum-doped metal carbonitride gate electrode 108n with desired electrical and materials properties. In one example, the aluminum-doped metal carbonitride gate electrode 108n may be annealed at a temperature between 300° C. and 500° C.

According to one embodiment of the invention, the amount of aluminum may be varied through a thickness of the aluminum-doped metal carbonitride gate electrode 108n. For example, the amount of aluminum may be gradually increased or decreased through a thickness of the aluminum-doped tantalum carbonitride gate electrode 108n. In one example, the amount of aluminum may be gradually increased through a thickness of the aluminum-doped tantalum carbonitride gate electrode 108n by sequentially decreasing the thickness of each metal carbonitride film 104a, 104b, 104c, . . . , 104n. In some embodiments, the aluminum concentration in the aluminum doped metal carbonitride gate electrode 108n is at least 5 (and in some embodiments, at least 10, 15, 20, 25, 30, 35, 40, 45, or even at least 50) atomic percent aluminum.

A large number of tantalum and titanium carbonitride precursors may be utilized for depositing the tantalum carbonitride films and titanium carbonitride films. A tantalum carbonitride precursor can contain Ta, C, and N, but an additional nitrogen source gas (e.g., NH$_3$) may be added as an additional source of nitrogen. Representative examples of tantalum carbonitride precursor containing "Ta—N" intra-molecular bonds include Ta(NMe$_2$)$_3$(NCMe$_2$Et) (TAIMATA), Ta(NEt$_2$)$_5$ (PDEAT), Ta(NMe$_2$)$_5$ (PDMAT), Ta(NEtMe)$_5$ (PEMAT), (tBuN)Ta(NMe$_2$)$_3$ (TBTDMT), (tBuN)Ta(NEt$_2$)$_3$ (TBTDET), (tBuN)Ta(NEtMe)$_3$ (TBTEMT), and (iPrN)Ta(NEt$_2$)$_3$ (IPTDET). Similarly, a titanium carbonitride precursor can contain Ti, C, and N but an additional nitrogen source gas (e.g., NH$_3$) may be added as an additional source of nitrogen. Representative examples of titanium carbonitride precursors containing "Ti—N" intra-molecular bonds include Ti(NEt$_2$)$_4$ (TDEAT), Ti(NMeEt)$_4$ (TEMAT), and Ti(NMe$_2$)$_4$ (TDMAT).

Embodiments of the invention may utilize a wide variety of aluminum precursors. For example, many aluminum precursors have the formula:

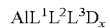

where L$^1$, L$^2$, L$^3$ are individual anionic ligands, and D is a neutral donor ligand where x can be 0, 1, or 2. Each L$^1$, L$^2$, L$^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Other examples of aluminum precursors include: AlMe$_3$, AlEt$_3$, AlMe$_2$H, [Al(OsBu)$_3$]$_4$, Al(CH$_3$COCHCOCH$_3$)$_3$, AlCl$_3$, AlBr$_3$, AlI$_3$, Al(OiPr)$_3$, [Al(NMe$_2$)$_3$]$_2$, Al(iBu)$_2$Cl, Al(iBu)$_3$, Al(iBu)$_2$H, AlEt$_2$Cl, Et$_3$Al$_2$(OsBu)$_3$, Al(THD)$_3$, H$_3$AlNMe$_3$, H$_3$AlNEt$_3$, H$_3$AlNMe$_2$Et, and H$_3$AlMeEt$_2$.

Figure 2A:
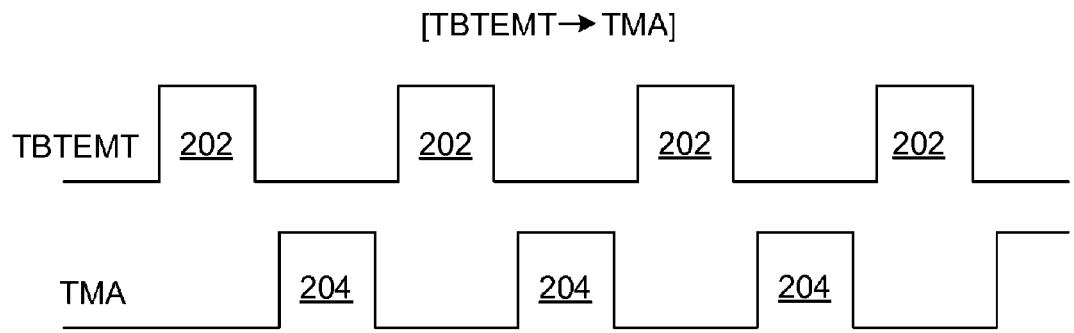
FIGS. 2A-2D are schematic gas flowcharts for depositing aluminum-doped tantalum carbonitride films on a substrate in a process chamber according to embodiments of the invention.

FIGS. 2A-2D are schematic gas flowcharts for depositing aluminum-doped tantalum carbonitride films on a substrate in a process chamber according to embodiments of the invention. The different flowcharts may be used to deposit aluminum-doped tantalum carbonitride films or aluminum-doped titanium carbonitride films with different elemental compositions. TBTEMT, NH$_3$, and TMA are used to illustrate the embodiments but other tantalum or titanium carbonitride precursors, additional nitrogen source gases, and aluminum precursors may be used. FIG. 2A schematically shows alternating exposures of TBTEMT gas pulses 202 and TMA gas pulses 204, denoted as [TBTEMT→TMA] deposition cycles. Although not shown in FIGS. 2A-2D, a purge gas such as Argon (Ar) may be utilized to continuously purge the process chamber or to purge the process chamber between gas pulses of reactant gases, e.g. TBTEMT, TMA, or NH$_3$.

Figure 2B:
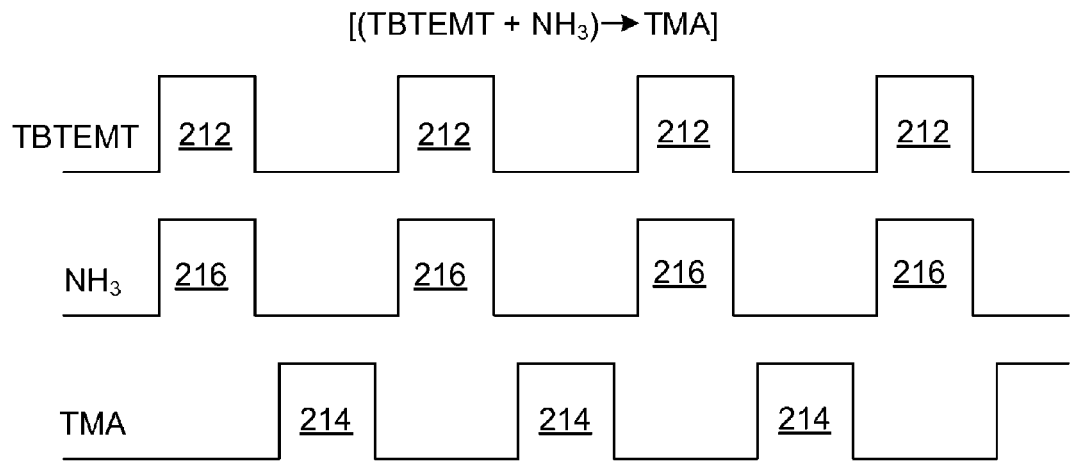

FIG. 2B schematically shows overlapping exposures of a TBTEMT gas pulse 212 and a NH$_3$ gas pulse 216, followed by a TMA gas pulse 214. This exposure sequence is denoted as a [(TBTEMT+NH$_3$)→TMA] deposition cycle.

Figure 2C:
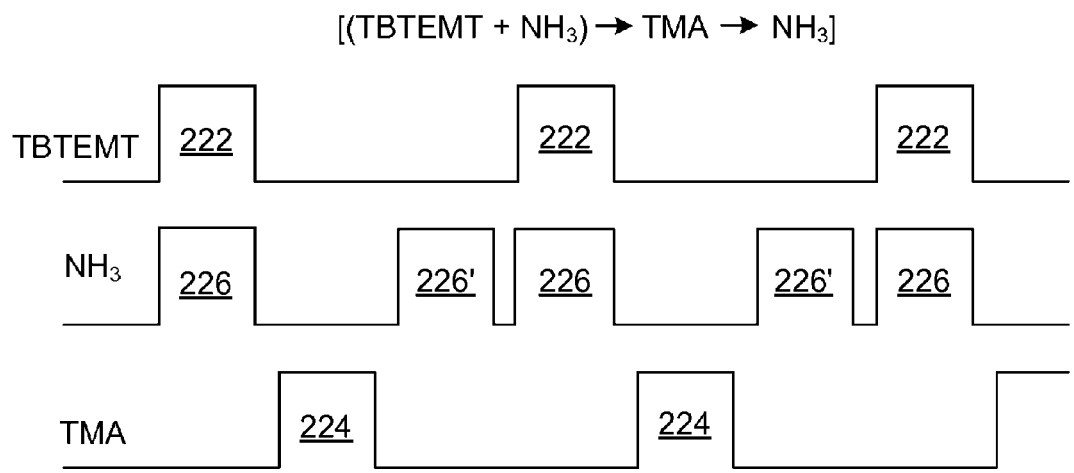

FIG. 2C schematically shows overlapping exposures of a TBTEMT gas pulse 222 and a NH$_3$ gas pulse 226, followed by a sequence of a TMA gas pulse 224 and an additional NH$_3$ gas pulse 226'. This exposure sequence is denoted as [(TBTEMT+NH$_3$)→TMA→NH$_3$] a deposition cycle. Although gas pulses 226' and 226 are shown as separate gas pulses, they may be combined into a single NH$_3$ gas pulse.

Figure 2D:
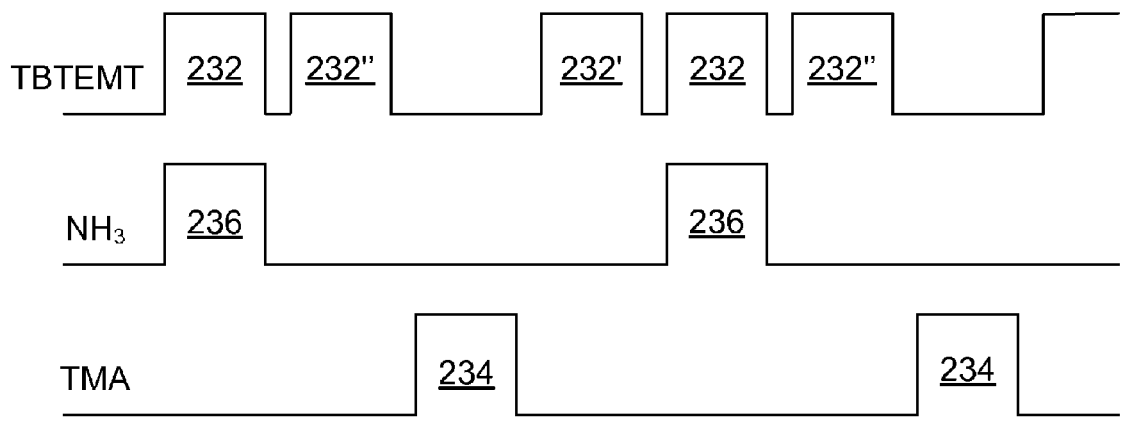

FIG. 2D schematically shows overlapping exposures of a TBTEMT gas pulse 232 and a NH₃ gas pulse 236, followed by a sequence of a second TBTEMT gas pulse of 232", a TMA gas pulse 234, and a third TBTEMT gas pulse 232'. This exposure sequence is denoted as a [(TBTEMT+NH₃)→TBTEMT→TMA→TBTEMT] deposition cycle. Although gas pulses 232', 232, and 232" are shown as separate gas pulses, two or more of the gas pulses may be combined into a single TBTEMT gas pulse.

In FIGS. 2A-2D, the different deposition cycles may be repeated any number of times until the aluminum-doped tantalum carbonitride gate electrode has a desired thickness.

Figure 3A:
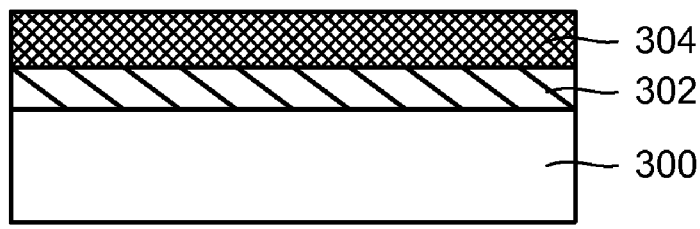
FIGS. 3A-3D show schematic cross-sectional views of gate stacks containing aluminum-doped metal carbonitride gate electrodes according to embodiments of the invention.
Figure 3B:
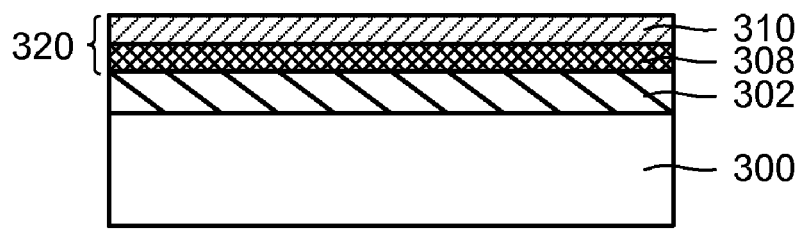
Figure 3C:
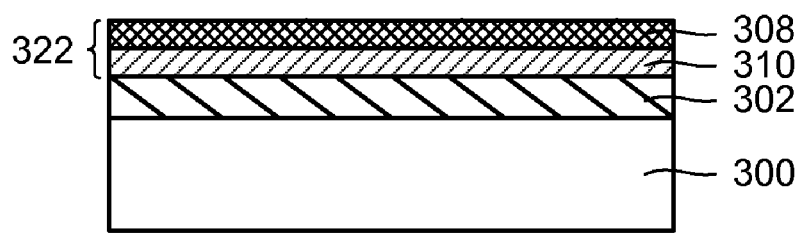
Figure 3D:
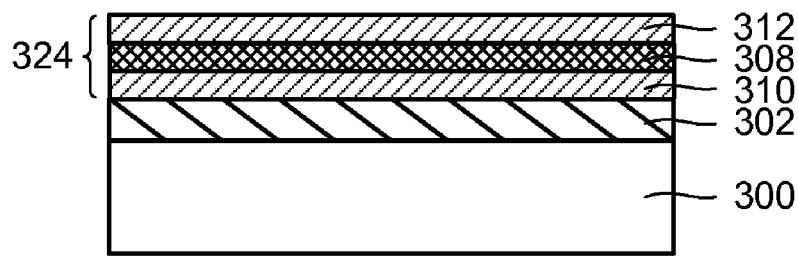

FIGS. 3A-3D show schematic cross-sectional views of gate stacks containing aluminum-doped metal carbonitride gate electrodes according to embodiments of the invention. FIG. 3A schematically shows a substrate 300 containing a high-k film 302 formed thereon and an aluminum-doped metal carbonitride gate electrode 304 formed on the high-k film 302. The aluminum-doped metal carbonitride gate electrode 304 is formed using [TBTEMT→TMA] deposition cycles shown in FIG. 2A. FIG. 3B shows a hybrid aluminum-doped metal carbonitride gate electrode 320 containing an aluminum-doped metal carbonitride gate electrode 308 formed on the high-k film 302 using [TBTEMT→TMA] deposition cycles and a metal carbonitride film 310 formed on the aluminum-doped metal carbonitride gate electrode 308 using a (TBTEMT+NH₃) exposure. FIG. 3C shows another hybrid aluminum-doped metal carbonitride gate electrode 322 containing a metal carbonitride film 310 formed on the high-k film 302 using a (TBTEMT+NH₃) exposure and an aluminum-doped metal carbonitride gate electrode 308 formed on the metal carbonitride film 310 using [TBTEMT→TMA] deposition cycles. FIG. 3D shows yet another hybrid aluminum-doped metal carbonitride gate electrode 324. The hybrid aluminum-doped metal carbonitride gate electrode 324 is similar to the hybrid aluminum-doped metal carbonitride gate electrode 322 shown in FIG. 3C but further contains a second metal carbonitride film 312 formed on the aluminum-doped metal carbonitride gate electrode 308 using a (TBTEMT+NH₃) exposure.

Still referring to FIGS. 3A-3D, according to other embodiments of the invention, the aluminum-doped metal carbonitride gate electrodes 304 and 308, may be formed using the [(TBTEMT+NH₃)→TMA] deposition cycle shown in FIG. 2B, the [(TBTEMT+NH₃)→TMA→NH₃] deposition cycle shown in FIG. 2C, or the [(TBTEMT+NH₃)→TBTEMT→TMA→TBTEMT] deposition cycle shown in FIG. 2D.

FIG. 4 shows experimental data for tantalum carbonitride films deposited on a substrate using a TBTEMT precursor. The tantalum carbonitride films were thermally deposited without the use of a plasma. Trace 401 shows the results for tantalum carbonitride films deposited using alternating exposures of TBTEMT gas pulses and NH₃ gas pulses. An atomic layer deposition (ALD) window is identified below about 300° C., where each TBTEMT gas pulse and NH₃ gas pulse results in a saturated surface reaction and the tantalum carbonitride film thickness is only weakly dependent on the substrate temperature. Above about 300° C., a chemical vapor deposition (CVD) regime is observed where TBTEMT gas exposure results in continuous film deposition and film growth rate is strongly dependent on the substrate temperature. Trace 402 shows tantalum carbonitride film growth rate as a function of substrate temperature for continuous exposures to a process gas containing TGTEMT precursor gas but not NH₃ gas. Trace 403 shows tantalum carbonitride film growth rate as a function of substrate temperature for continuous exposures to a process gas containing TGTEMT precursor gas and NH₃ gas. Traces 402 and 403 show that formation of tantalum carbonitride films by thermal decomposition of TGTEMT precursor is obtained at substrate temperatures greater than about 300° C. with a feed rate limited growth rate of about 13-15 nm/min.

FIG. 5 shows experimental data for aluminum concentration in aluminum-doped tantalum carbonitride films as a function of substrate temperature. The aluminum content was measured by X-ray fluorescence (XRF) spectroscopy. Referring to the gas flowchart in FIG. 2A and trace 501 in FIG. 5, the aluminum-doped tantalum carbonitride films were deposited using 32 [TBTEMT→TMA] deposition cycles. Referring to the gas flowchart in FIG. 2C and trace 502 in FIG. 5, the aluminum-doped tantalum carbonitride films were deposited using 32 of [(TBTEMT+NH₃)→TMA→NH₃] deposition cycles. In traces 501 and 502, the average tantalum carbonitride thickness per deposition cycle was about 0.4 nm and each TMA gas pulse duration was 3 seconds. Traces 501 and 502 show that TMA exposures below about 500° C. resulted in saturated surface reactions and formation of atomic layers of aluminum but TMA exposures above 500 C resulted in thermal self-decomposition of TMA on the substrate.

Figure 6:
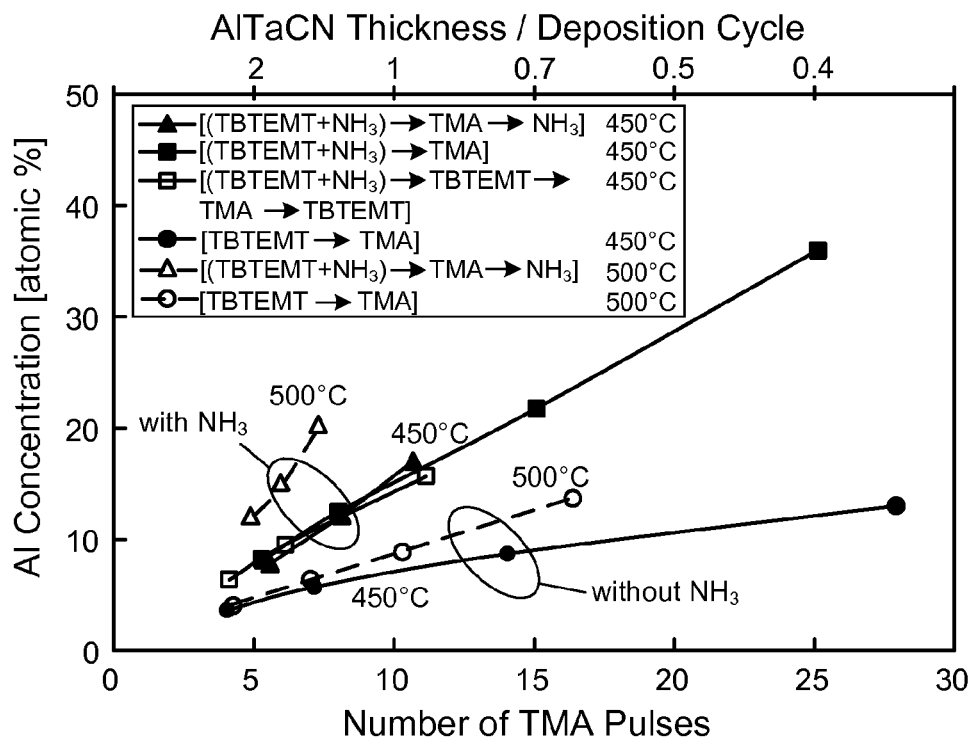
FIG. 6 shows experimental data for aluminum concentration in aluminum-doped tantalum carbonitride films as a function of the total number of TMA pulses.

FIG. 6 shows experimental data for aluminum concentration in aluminum-doped tantalum carbonitride films as a function of the total number of TMA pulses. The substrate temperatures were 450° C. and 500° C. and the total thickness of each aluminum-doped tantalum carbonitride film was about 10 nm. FIG. 6 also shows the thickness of the aluminum-doped tantalum carbonitride film deposited in each deposition cycle. The aluminum concentration was measured by XRF spectroscopy and ranged from about 4 atomic percent to greater than about 35 atomic percent. The aluminum concentration was varied by selecting different tantalum carbonitride film thicknesses deposited in each deposition cycle. For example, [(TBTEMT+NH₃)→TMA], [(TBTEMT+NH₃)→TMA→NH₃], and [(TBTEMT+NH₃)→TBTEMT→TMA→TBTEMT] deposition cycles resulted in aluminum concentrations of about 8 atomic percent when using a total of 5 TMA gas pulses and about 15 atomic percent when using a total of 10 TMA gas pulses. In another example, [TBTEMT→TMA] deposition cycles resulted in aluminum concentrations of about 4 atomic percent when using a total of 5 TMA gas pulses and about 7 atomic percent when using a total of 10 TMA gas pulses. Thus, the aluminum concentrations were about twice as high when using co-exposures of TBTEMT gas and NH₃ gas compared to exposures of TBTEMT gas without NH₃ gas. In summary, aluminum concentrations in aluminum-doped tantalum carbonitride films may be adjusted over a wide range by adjusting the thickness of a tantalum carbonitride film deposited in each cycle and co-exposure of TBTEMT gas and NH₃ gas.

Figure 7:
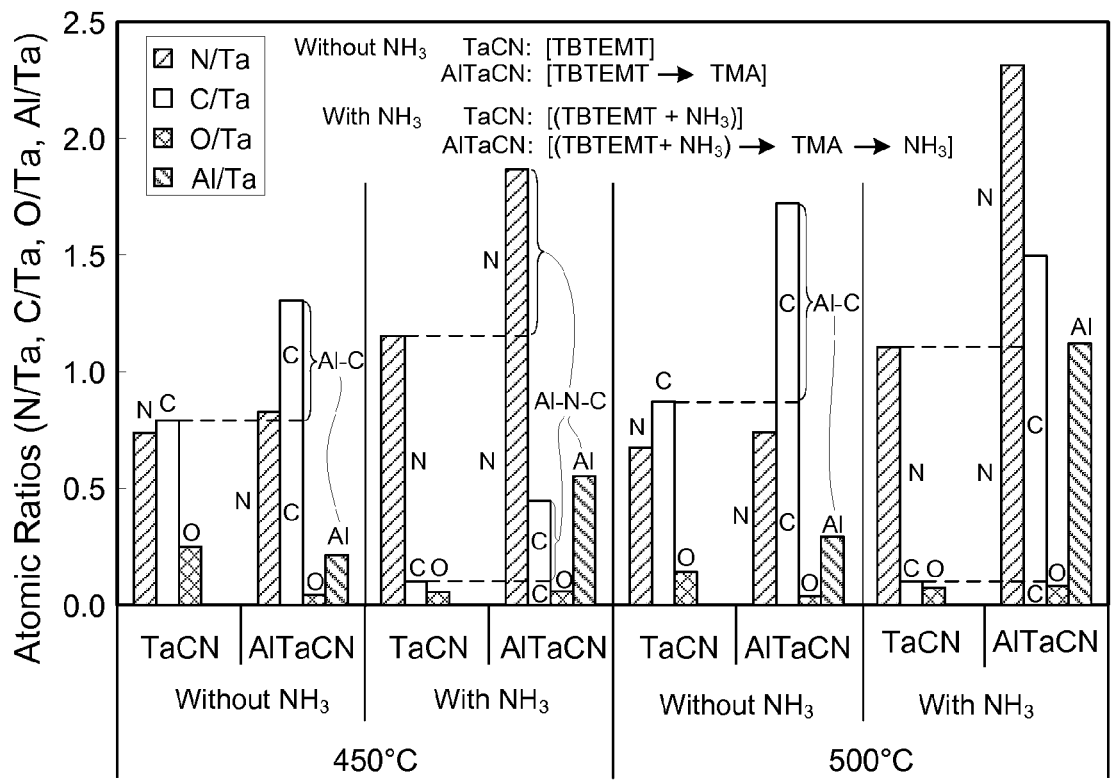
FIG. 7 shows composition of tantalum carbonitride films and aluminum-doped tantalum carbonitride films as a function of processing conditions.

FIG. 7 shows composition of tantalum carbonitride films and aluminum-doped tantalum carbonitride films as a function of processing conditions. A TBTEMT tantalum precursor and a TMA aluminum precursor were used. The experimental data shows that AlTaCN films have higher C concentration than TaCN films, due to reduced removal of methyl groups from TMA precursor adsorbed on the substrate surface. Furthermore, [(TBTEMT+NH₃)] deposition cycles resulted in increased N film concentration and decreased C concentration compared to [TBTEMT] exposures. In addition, compared to [(TBTEMT→TMA] deposition cycles, [(TBTEMT+NH₃)→TMA→NH₃] deposition cycles resulted in increased Al content, and increased N film content and decreased C film content due to AlN formation from reaction of $NH_3$ with adsorbed TMA precursor. Oxygen incorporation into the films was due to air exposure after the film deposition.

Figure 8:
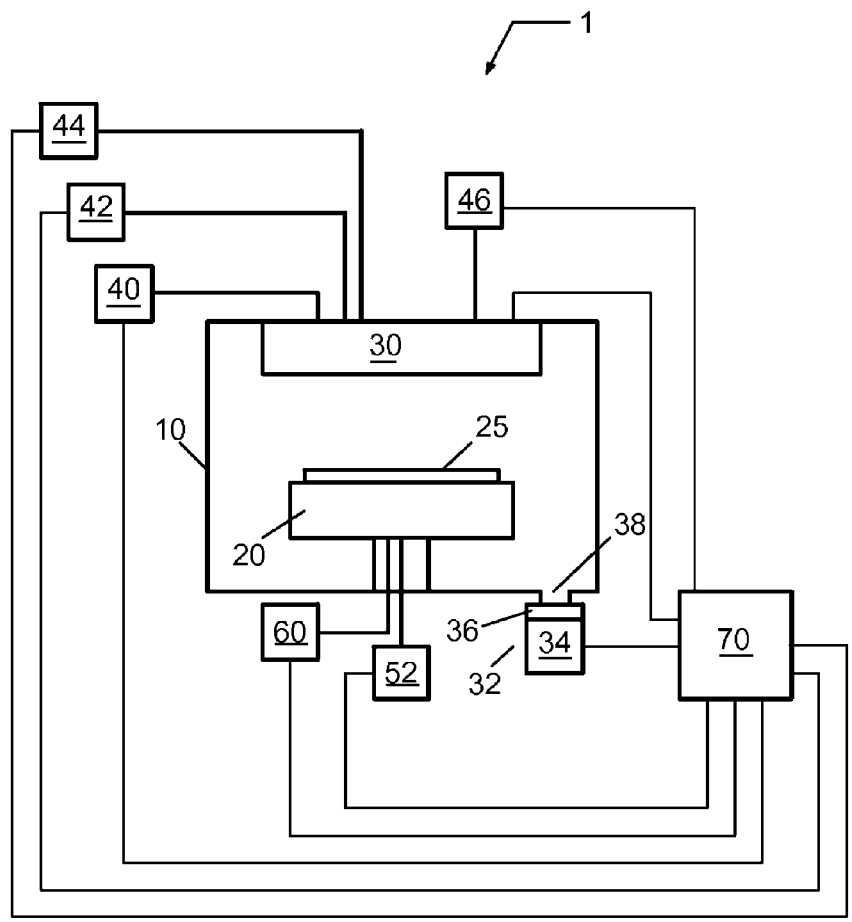
FIG. 8 depicts a schematic view of a processing system for forming aluminum-doped metal carbonitride gate electrodes in accordance with embodiments of the invention.

FIG. 8 depicts a schematic view of a processing system for forming aluminum-doped metal carbonitride gate electrodes in accordance with embodiments of the invention. As those skilled in the art will readily recognize, the processing system 1 can be utilized to perform various deposition processes, including thermal CVD. The processing system 1 includes a process chamber 10 having a substrate holder 20 configured to support a substrate 25 upon which the aluminum-doped metal carbonitride gate electrode is to be formed. The process chamber 10 further contains an upper assembly 30 (e.g., a showerhead) coupled to a first process material supply system 40, a second process material supply system 42, a third process material supply system 44, and a purge gas supply system 46. Additionally, the processing system 1 includes a substrate temperature control system 60 coupled to substrate holder 20 and configured to elevate and control the temperature of substrate 25.

The processing system 1 may be configured to process 200 mm substrates, 300 mm substrates, or larger-sized substrates. In fact, it is contemplated that the deposition system may be configured to process substrates, wafers, or flat panel displays regardless of their size, as would be appreciated by those skilled in the art. Therefore, while aspects of the invention will be described in connection with the processing of a semiconductor substrate, the invention is not limited solely thereto.

The first process material supply system 40, the second process material supply system 42, and third process material supply system 44 are configured to simultaneously or alternately introduce a first, second, and process materials to the process chamber 10. The alternating introduction of the first, second, and third process materials can be cyclical, or it may be acyclical with variable time periods between introduction of the first, second, and third process materials. The first process material can contain a tantalum carbonitride precursor, a titanium carbonitride precursor, or both. For instance, the tantalum or titanium carbonitride precursor can originate as a solid phase, a liquid phase, or a gaseous phase, and it may be delivered to process chamber 10 in a gaseous phase with or without the use of a carrier gas (e.g., a noble gas or $N_2$). The second process material can, for example, comprise an additional nitrogen source gas, and it may be delivered to process chamber 10 with or without the use of a carrier gas. The second process material can contain $NH_3$, $NH(CH_3)_2$, $N_2H_4$, or $N_2H_3CH_3$, or a combination of two or more thereof. The third process material supply system 44 can be configured for introducing a third process material containing an aluminum precursor. Examples of tantalum carbonitride precursors, titanium carbonitride precursors, and aluminum precursors were described above.

Additionally, the purge gas supply system 46 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a noble gas (i.e., helium, neon, argon, xenon, krypton), $N_2$, or $H_2$.

Still referring to FIG. 8, processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the processing system 1.

In order to improve the thermal transfer between substrate 25 and substrate holder 20, the substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate 25 is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 25, and suitable for use of the first, second, and third process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure measuring device can, for example, be a capacitance manometer.

The processing system 1 includes a controller 70 than can be used to configure any number of processing elements of the processing system 1, and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs of the processing elements of the processing system 1 as well as monitor outputs from the processing system 1. For example, a program stored in the memory may be utilized to activate the inputs to the aforementioned components of the processing system 1 according to a process recipe in order to perform an etching process, or a deposition process.

The controller 70 may be implemented as a general purpose computer system that performs a portion or all of the microprocessor based processing steps of embodiments of the invention in response to a processor executing one or more sequences of one or more instructions contained in a memory.

Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing embodiments the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

A plurality of embodiments for forming aluminum-doped metal carbonitride gate electrodes have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a first film "on" a second film is directly on and in immediate contact with the second film unless such is specifically stated; there may be a third film or other structure between the first film and the second film on the first film.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
   providing a substrate containing a dielectric layer thereon; and
   forming an aluminum-doped metal carbonitride gate electrode on the dielectric layer in the absence of plasma by:
   depositing a metal carbonitride film by exposing the substrate to a gas pulse of a metal carbonitride precursor, the metal carbonitride precursor comprising tantalum, titanium, or a combination thereof,
   adsorbing an atomic layer of an aluminum precursor on the metal carbonitride film by exposing the substrate to a gas pulse of the aluminum precursor, wherein, during the depositing and adsorbing, the substrate is maintained at a temperature above the thermal decomposition temperature of the metal carbonitride precursor and below the thermal decomposition temperature of the aluminum precursor, and
   repeating the depositing and adsorbing at least once.

2. The method of claim 1, wherein the depositing and adsorbing have no temporal overlap.

3. The method of claim 1, wherein depositing the metal carbonitride film is performed without exposing the substrate to gas pulse containing an additional nitrogen source gas.

4. The method of claim 1, wherein depositing the metal carbonitride film further comprises exposing the substrate to gas pulse containing an additional nitrogen source gas having at least partial temporal overlap with the gas pulse of the metal carbonitride precursor.

5. The method of claim 1, wherein the metal carbonitride precursor comprises a tantalum carbonitride precursor having Ta—N intra-molecular bonds.

6. The method of claim 1, wherein the metal carbonitride precursor comprises a titanium carbonitride precursor having Ti—N intra-molecular bonds.

7. The method of claim 1, wherein the aluminum precursor comprises $AlMe_3$, $AlEt_3$, $AlMe_2H$, $[Al(OsBu)_3]_4$, Al(CH$_3$COCHCOCH$_3$)$_3$, AlCl$_3$, AlBr$_3$, AlI$_3$, Al(OiPr)$_3$, [Al(NMe$_2$)$_3$]$_2$, Al(iBu)$_2$Cl, Al(iBu)$_3$, Al(iBu)$_2$H, AlEt$_2$Cl, Et$_3$Al$_2$(OsBu)$_3$, Al(THD)$_3$, H$_3$AlNMe$_3$, H$_3$AlNEt$_3$, H$_3$AlNMe$_2$Et, or H$_3$AlMeEt$_2$.

8. The method of claim 1, wherein the aluminum-doped metal carbonitride gate electrode comprises between 5 and 50 atomic percent aluminum.

9. The method of claim 3, further comprising:
depositing a first additional metal carbonitride film on the dielectric layer prior to depositing the metal carbonitride film and/or depositing a second additional metal carbonitride film on the aluminum-doped metal carbonitride gate electrode, wherein depositing the first and/or second additional metal carbonitride film comprises exposing the substrate to a gas pulse of an additional metal carbonitride precursor and an additional nitrogen source gas, the additional metal carbonitride precursor comprising tantalum, titanium, or a combination thereof, and the additional nitrogen source gas comprising NH$_3$, NH(CH$_3$)$_2$, N$_2$H$_4$, or N$_2$H$_3$CH$_3$.

10. The method of claim 4, wherein the gas pulse containing the additional nitrogen source gas comprises NH$_3$, NH(CH$_3$)$_2$, N$_2$H$_4$, or N$_2$H$_3$CH$_3$.

11. The method of claim 4, wherein the forming further comprises exposing the substrate to a second gas pulse of the additional nitrogen source gas, wherein the second gas pulse of the additional nitrogen source gas has no overlap with the gas pulse of the metal carbonitride precursor or with the gas pulse of the aluminum precursor.

12. The method of claim 4, wherein depositing the metal carbonitride film further comprises exposing the substrate to an additional gas pulse of the metal carbonitride precursor having no overlap with the gas pulse of the metal carbonitride precursor or the gas pulse of the aluminum precursor.

13. The method of claim 4, further comprising:
depositing an additional metal carbonitride film on the aluminum-doped metal carbonitride gate electrode, wherein depositing the additional metal carbonitride film comprises exposing the substrate to a gas pulse of an additional metal carbonitride precursor and an additional nitrogen source gas, the additional metal carbonitride precursor comprising tantalum, titanium, or a combination thereof.

14. The method of claim 5, wherein the tantalum carbonitride precursor comprises Ta(NMe$_2$)$_3$(NCMe$_2$Et) (TAIMATA), Ta(NEt$_2$)$_5$ (PDEAT), Ta(NMe$_2$)$_5$ (PDMAT), Ta(NEtMe)$_5$ (PEMAT), (tBuN)Ta(NMe$_2$)$_3$ (TBTDMT), (tBuN)Ta(NEt$_2$)$_3$ (TBTDET), (tBuN)Ta(NEtMe)$_3$ (TBTEMT), or (iPrN)Ta(NEt$_2$)$_3$ (IPTDET).

15. The method of claim 6, wherein the titanium carbonitride precursor is comprises Ti(NEt$_2$)$_4$ (TDEAT), Ti(NMeEt)$_4$ (TEMAT), or Ti(NMe$_2$)$_4$ (TDMAT).

16. A method of forming a semiconductor device, the method comprising:
providing a substrate containing a high-k film thereon; and
forming an aluminum-doped metal carbonitride gate electrode on the high-k film in the absence of plasma, the forming comprising:
depositing a metal carbonitride film by exposing the substrate to a gas pulse of a metal carbonitride precursor and exposing the substrate to gas pulse containing an additional nitrogen source gas having at least partial temporal overlap with the gas pulse of the metal carbonitride precursor, the metal carbonitride precursor comprising a tantalum carbonitride precursor having Ta—N intra-molecular bonds or a titanium carbonitride precursor having Ti—N intra-molecular bonds,
adsorbing an atomic layer of an aluminum precursor on the metal carbonitride film by exposing the substrate to a gas pulse of the aluminum precursor, wherein the depositing and adsorbing have no temporal overlap, and during the depositing and adsorbing, the substrate is maintained at a temperature above the thermal decomposition temperature of the metal carbonitride precursor and below the thermal decomposition temperature of the aluminum precursor, and
repeating the depositing and adsorbing at least once.

17. The method of claim 16, wherein the gas pulse containing the additional nitrogen source gas comprises NH$_3$, NH(CH$_3$)$_2$, N$_2$H$_4$, or N$_2$H$_3$CH$_3$.

18. The method of claim 16, wherein the tantalum carbonitride precursor comprises Ta(NMe$_2$)$_3$(NCMe$_2$Et) (TAIMATA), Ta(NEt$_2$)$_5$ (PDEAT), Ta(NMe$_2$)$_5$ (PDMAT), Ta(NEtMe)$_5$ (PEMAT), (tBuN)Ta(NMe$_2$)$_3$ (TBTDMT), (tBuN)Ta(NEt$_2$)$_3$ (TBTDET), (tBuN)Ta(NEtMe)$_3$ (TBTEMT), or (iPrN)Ta(NEt$_2$)$_3$ (IPTDET), the titanium carbonitride precursor comprises Ti(NEt$_2$)$_4$ (TDEAT), Ti(NMeEt)$_4$ (TEMAT), or Ti(NMe$_2$)$_4$ (TDMAT), and the aluminum precursor comprises AlMe$_3$, AlEt$_3$, AlMe$_2$H, [Al(OsBu)$_3$]$_4$, Al(CH$_3$COCHCOCH$_3$)$_3$, AlCl$_3$, AlBr$_3$, AlI$_3$, Al(OiPr)$_3$, [Al(NMe$_2$)$_3$]$_2$, Al(iBu)$_2$Cl, Al(iBu)$_3$, Al(iBu)$_2$H, AlEt$_2$Cl, Et$_3$Al$_2$(OsBu)$_3$, Al(THD)$_3$, H$_3$AlNMe$_3$, H$_3$AlNEt$_3$, H$_3$AlNMe$_2$Et, or H$_3$AlMeEt$_2$.

19. The method of claim 16, wherein the aluminum-doped metal carbonitride gate electrode comprises between 5 and 50 atomic percent aluminum.

20. A method of forming a semiconductor device, the method comprising:
providing a substrate containing a high-k film thereon; and
forming an aluminum-doped tantalum carbonitride gate electrode on the high-k film in the absence of plasma, the forming comprising:
depositing a tantalum carbonitride film by exposing the substrate to a gas pulse of a (tBuN)Ta(NEtMe)$_3$ (TBTEMT) precursor,
adsorbing an atomic layer of an AlMe$_3$ precursor on the tantalum carbonitride film by exposing the substrate to a gas pulse of the AlMe$_3$ precursor, wherein, during the depositing and adsorbing, the substrate is maintained at a temperature above the thermal decomposition temperature of the (tBuN)Ta(NEtMe)$_3$ (TBTEMT) precursor and below the thermal decomposition temperature of the AlMe$_3$ precursor, and
repeating the depositing and adsorbing at least once, wherein the aluminum-doped tantalum carbonitride gate electrode comprises between 5 and 50 atomic percent aluminum.

* * * * *